United States Patent
Chae

(10) Patent No.: US 7,630,223 B2
(45) Date of Patent: Dec. 8, 2009

(54) MEMORY DEVICE AND METHOD OF ARRANGING SIGNAL AND POWER LINES

(75) Inventor: Bong-Seok Chae, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 379 days.

(21) Appl. No.: 11/567,655

(22) Filed: Dec. 6, 2006

(65) Prior Publication Data

US 2007/0147101 A1    Jun. 28, 2007

(30) Foreign Application Priority Data

Dec. 22, 2005   (KR) ................... 10-2005-0128159

(51) Int. Cl.
*G11C 5/06* (2006.01)

(52) U.S. Cl. .................. 365/63; 365/207; 365/208; 365/226; 365/230.03

(58) Field of Classification Search ............... 365/63 O, 365/207 X, 208 X, 226 X, 230.03 X, 63, 365/207, 208, 226, 230.03
See application file for complete search history.

(56) References Cited

U.S. PATENT DOCUMENTS

| | | | |
|---|---|---|---|
| 5,966,340 A | | 10/1999 | Fujino et al. |
| 6,104,630 A | * | 8/2000 | Hidaka ........................ 365/63 |
| 6,275,407 B1 | | 8/2001 | Otsuka |
| 6,483,763 B2 | * | 11/2002 | Uchikoba et al. ........... 365/205 |

FOREIGN PATENT DOCUMENTS

JP    2003-338185    11/2003

OTHER PUBLICATIONS

English language abstract of Japanese Publication No. 2003-338185.

* cited by examiner

*Primary Examiner*—VanThu Nguyen
(74) *Attorney, Agent, or Firm*—Marger Johnson & McCollom, P.C.

(57) ABSTRACT

A memory device and method for arranging signal and power lines includes a plurality of sub-memory cell arrays having a plurality of memory cells, a plurality of sense amplifiers to sense and amplify data from the plurality of memory cells, a plurality of power lines to provide power to the sense amplifiers, where at least one of the power lines is disposed over a first set of the sense amplifiers and the sub-memory cell arrays, and at least another one of the power lines is disposed over second set of the sense amplifiers and the sub-memory cell arrays.

19 Claims, 4 Drawing Sheets

MEMORY DEVICE AND METHOD OF ARRANGING SIGNAL AND POWER LINES

RELATED APPLICATION

This application claims the priority to Korean Patent Application No. 2005-128159, filed Dec. 22, 2005, which is incorporated by reference.

BACKGROUND OF THE INVENTION

1. Field of the Invention

The present invention relates to a memory device and a method of arranging signal and power lines.

2. Description of the Related Art

Semiconductor memory devices are typically divided into a memory cell array region and a peripheral circuit region. The memory cell array region includes sub-memory cell arrays and sense amplifier regions located adjacent to the sub-memory cell arrays. Memory cells are formed on a lower layer of the sub-memory cell arrays, and devices, such as transistors constituting a sense amplifier, a pre-charge circuit, a data input/output gate, etc., are formed on a lower layer of the sense amplifier regions. Signal and power lines are often disposed horizontally and vertically over the sense amplifier regions in two metal layers. The signal lines connect with the lower layer devices and some of the power lines through contacts.

FIG. 1 illustrates a conventional semiconductor memory device. Referring to FIG. 1, the semiconductor memory device includes a memory cell array 10, a column decoder 20, and a row decoder 30. The memory cell array 10 includes multiple sub-memory cell arrays SMCA and sub-word line drivers SWD alternately disposed in vertically columns. The memory cell array 10 includes conjunction regions CJ and sense amplifiers SA also alternately disposed in vertically columns. Each conjunction region CJ is adjacent to a sub-word line driver SWD, and each sense amplifier SA is adjacent to sub-memory cell arrays SMCA. In other words, the semiconductor memory device includes rows of alternating sub-memory cell arrays SMCA and sense amplifiers SA, and rows of alternating sub-word line drivers SWD and conjunction regions CJ.

The memory cell array 10 includes a memory cell MC connected to a sub-word line SWL and a bit line BL. During memory access operations to the memory cell MC, the column decoder 20 selects a column selection signal CSL responsive to a column address CA and the row decoder 30 selects a word line selection signal PX responsive to a row address RA. The row decoder may select a main word line (not shown) that is combined with the word line selection signal PX to access the memory cell MC. The conjunction regions CJ include control signal generation circuits for controlling a sub-word line driver SWD and a sense amplifier SA. The sense amplifier SA includes sense amplifiers, a pre-charge circuit, a data input/output gate, etc.

The semiconductor memory device includes a plurality of signal lines, such as local data input/output lines LIO and global data input/output lines GIO, and a plurality of power lines P1 and P2. Power lines P1, word selection signal line PX, and the local data input/output line LIO are configured to vertically cross over the conjunction regions CJ and the sense amplifiers SA. Power lines P2 and global data input/output lines GIO are configured to horizontally cross over the sense amplifiers SA and the sub-memory cell arrays SMCA. The power lines P2 are disposed on both sides of the global data input/output lines GIO to help ensure the stable supply of power and signals by the global data input/output lines GIO.

As the size of these semiconductor memory devices decreases, the layout area allocated for the sense amplifier SA is also reduced, thus rendering the power and signal line configuration of the semiconductor memory device difficult to implement. Furthermore, as the number of global data input/output lines GIO increases, the number of power lines P2 and contacts to the signals also increases. Accordingly, the top layout of the sense amplifiers may become significantly complicated and difficult, if not impossible, to implement.

SUMMARY OF THE INVENTION

Embodiments of the invention provide a simplified layout of a memory device. The memory device layout may be simplified by diminishing the number of power lines disposed over a sense amplifier region. The memory device and method for arranging signal and power lines includes a plurality of sub-memory cell arrays having a plurality of memory cells, a plurality of sense amplifiers to sense and amplify data from the plurality of memory cells, a plurality of power lines to provide power to the sense amplifiers, where at least one of the power lines is disposed over a first set of the sense amplifiers and the sub-memory cell arrays, and at least another one of the power lines is disposed over second set of the sense amplifiers and the sub-memory cell arrays.

BRIEF DESCRIPTION OF THE DRAWINGS

The features and advantages of the invention will become more apparent with a detailed description of example embodiments referencing the attached drawings.

DETAILED DESCRIPTION OF THE INVENTION

Figure 1:
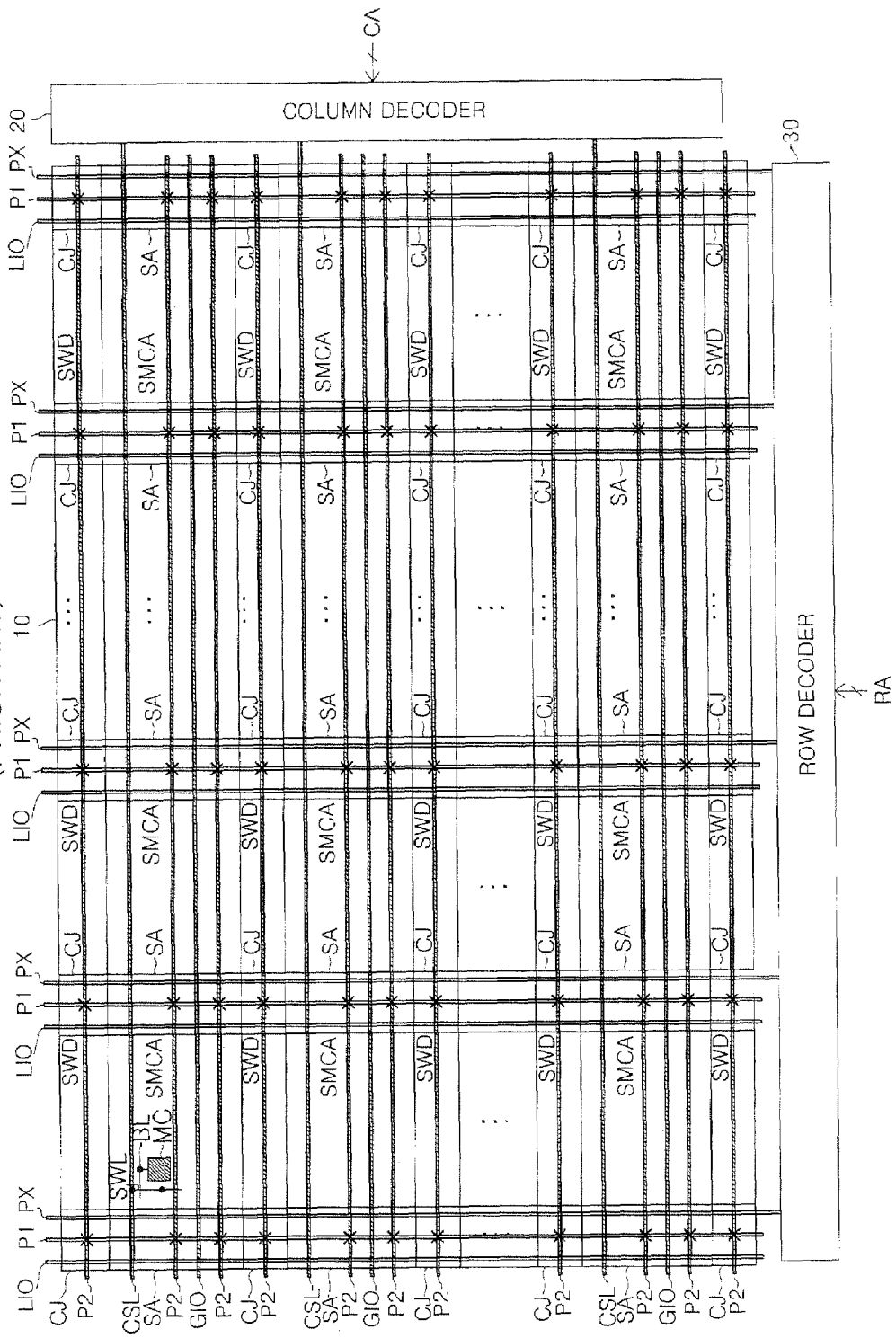
FIG. 1 illustrates a conventional semiconductor memory device.
Figure 2:
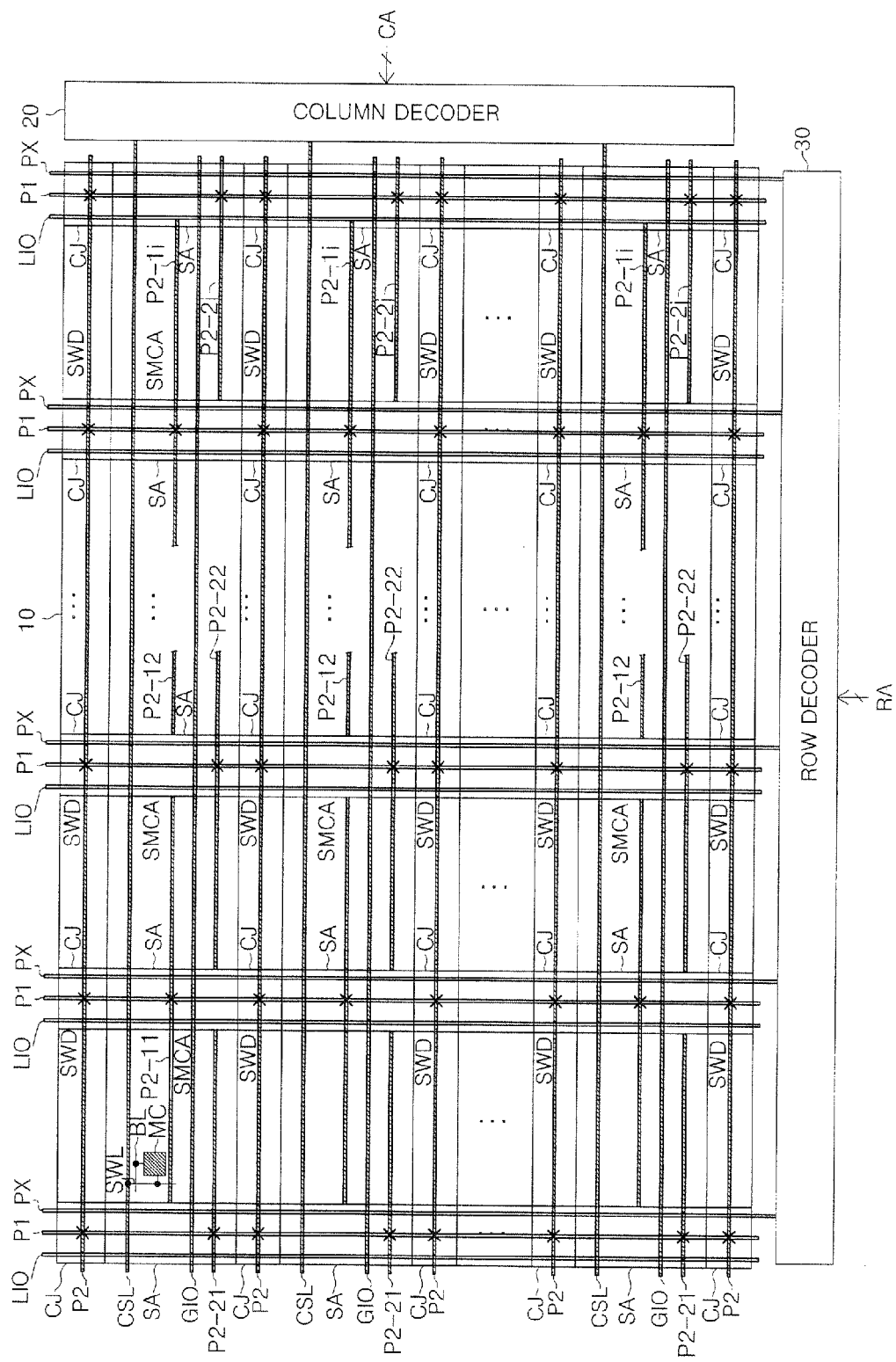
FIG. 2 illustrates a memory device according to embodiments of the present invention.

FIG. 2 illustrates a memory device according to embodiments of the present invention. Referring to FIG. 2, the memory device includes a memory array region 10, a column decoder 20, and a row decoder 30. The memory array region 10 includes sub-memory cell arrays SMCA, each having one or more memory cells MC to store data. The memory array region 10 includes sub-word line drivers SWD to drive sub-word line signals SWL coupled to the memory cells.

The memory array region 10 includes sense amplifiers SA to sense and amplify data from the memory cells MC. The sense amplifiers SA may also include a pre-charge circuit, a data input/output gate, or the like. The memory array region 10 includes conjunction regions CJ to control the sub-word line drivers SWD and the sense amplifiers SA, for example, with control signal generation circuits.

The memory array region 10 may be configured in a row-column format with one type of column, such as even columns, including the sub-memory cell arrays SMCA and the sub-word line drivers SWD and the other type of column, such as odd columns, including the sense amplifiers SA and conjunction regions CJ. For instance, the sub-memory cell arrays SMCA and the sub-word line drivers SWD may be alternately disposed in the even vertical columns of the memory array region 10, and the sense amplifiers SA and conjunction regions CJ may be alternately disposed in the odd vertical columns of the memory array region 10. The columns may be alternatively disposed such that the rows of the memory array region 10 include either sub-memory cell arrays SMCA and sense amplifiers SA, or sub-word line drivers SWD and conjunction regions CJ.

During memory access operations to the memory cell MC, the column decoder 20 selects a column selection signal CSL responsive to a column address CA, and the row decoder 30 selects a word line selection signal PX responsive to a row address RA. The row decoder may select a main word line (not shown) that is combined with the word line selection signal PX to access the memory cell MC. The sense amplifiers SA senses and amplifies data stored in the memory cell MC selected according to the column select signal CSL and the world line selection signal PX. The sense amplifiers SA may then provide the amplified data to local data input/output lines LIO and global data input/output lines GIO.

The memory device includes a plurality of signal lines, such as the local data input/output lines LIO and the global data input/output lines GIO, and a plurality of power lines P1, P2, P2-11 to P2-1$i$, and P2-21 to P2-2$i$. The power lines P1, word selection signal line PX, and the local data input/output line LIO are configured to vertically cross over the columns of conjunction regions CJ and sense amplifiers SA. The global data input/output lines GIO are configured to horizontally cross over rows including sense amplifiers SA and sub-memory cell arrays SMCA. The power lines P2 are configured to horizontally cross over rows including conjunction regions CJ and sub-word line drivers SWD and provide power to the conjunction regions CJ and sub-word line drivers SWD.

The power lines P2-11 to P2-1$i$ and P2-21 to P2-2$i$ may be disposed on different sides of the global data input/output lines GIO to ensure a stable supply of power and signals by the global data input/output lines GIO. For instance, the power lines P2-11 to P2-1$i$ may be configured to horizontally cross over even sense amplifiers SA and sub-memory cell arrays SMCA, while the power lines P2-21 to P2-2$i$ may be configured to horizontally cross over odd sense amplifiers SA and sub-memory cell arrays SMCA. Since the sense amplifiers SA crossed over by the power lines P2-21 to P2-2$i$ are not crossed over by power lines P2-11 to P2-1$i$, and vice versa, the structure or configuration of the sense amplifiers SA may be simplified. Although FIG. 2 shows a single global data input/output line GIO crossing each sense amplifier SA and sub-memory cell array SMCA, in some embodiments multiple the global data input/output lines GIO, such as a pair of global data input/output lines GIO.

In other words, the sense amplifiers SA may not have power lines P2-11 to P2-1$i$ and P2-21 to P2-2$i$ disposed at both sides of the global data input/output lines GIO, but the power lines P2-11 to P2-1$i$ and P2-21 to P2-2$i$ may be disposed on both sides of the global data input/output lines GIO on the sub-memory cell arrays SMCA. Contacts X may be formed over the sense amplifiers SA between the power line P1 disposed on a first metal layer and the power line P2-11 to P2-1$i$ and P2-21 to P2-2$i$ disposed on a second metal layer. The power line P1 may transmit the same power as the power lines P2-11 to P2-1$i$ and P2-21 to P2-2$i$ coupled to the power line P1 by the contact X.

Figure 3:
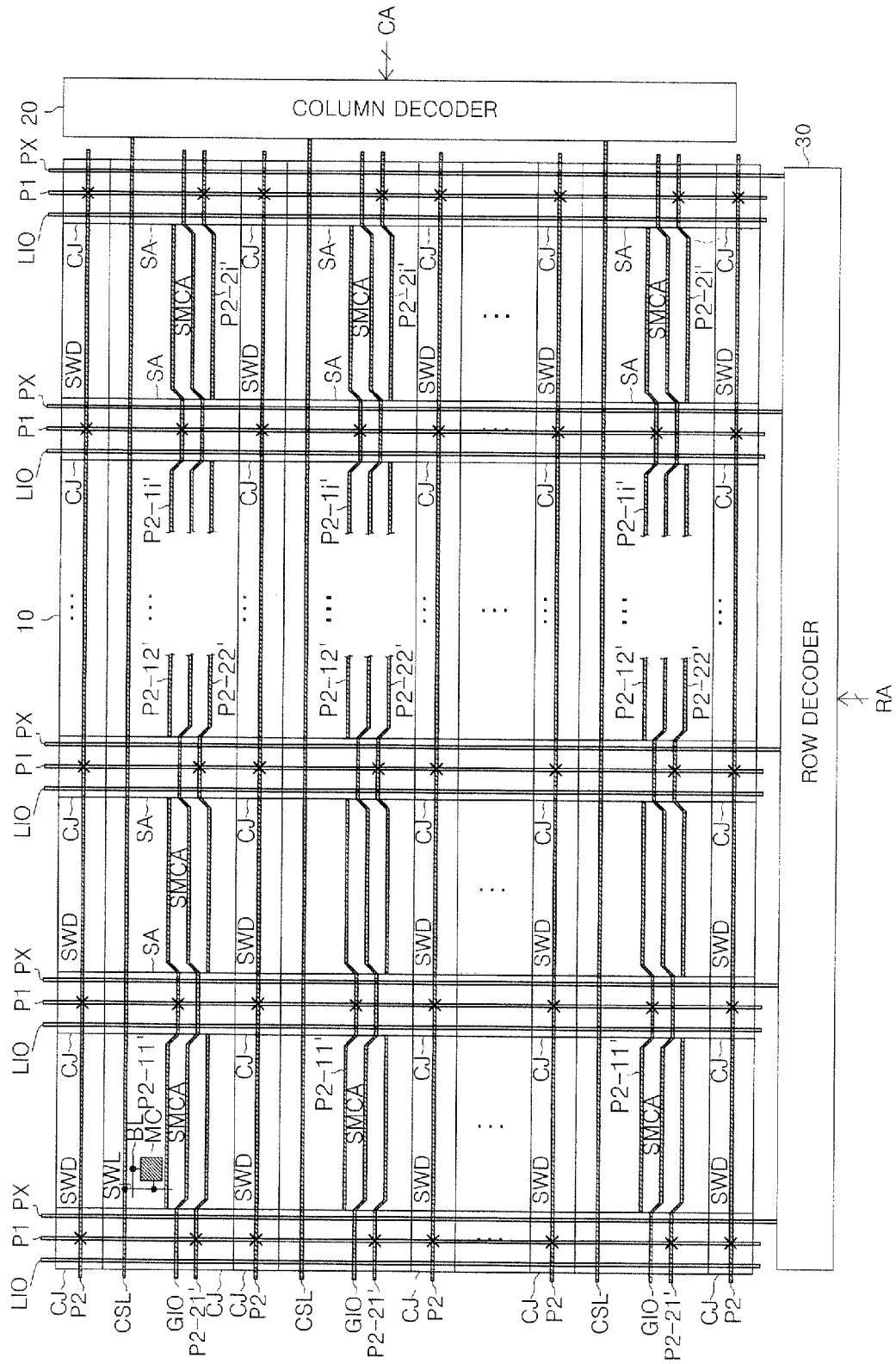
FIG. 3 illustrates another memory device according to embodiments of the present invention.

FIG. 3 illustrates another memory device according to embodiments of the present invention. Referring to FIG. 3, the memory device includes a memory array region 10, a column decoder 20, and a row decoder 30 similar to those shown and described above referencing FIG. 2. The memory array region 10, however, includes a different configuration for the global data input/output lines GIO and power lines crossing over sense amplifiers SA and sub-memory cell arrays SMCA.

The memory array region 10 includes power lines P2-11' to P2-1$i$' and P2-21' to P2-2$i$' to provide power to the sense amplifiers SA. Each of the power lines P2-11' to P2-1$i$' and P2-21' to P2-2$i$' may disposed or formed in a straight line over sense amplifiers SA and portions of the sub-memory cell arrays SMCA. The power lines P2-11' to P2-1$i$' may branches off diagonally in some portions over the sub-memory cell arrays SMCA, for example, in the regions of the sub-memory cell arrays SMCA closest to the sense amplifiers SA. The power lines P2-11' to P2-1$i$' may be configured to cross over even sense amplifiers SA, while the power lines P2-21' to P2-2$i$' may configured to cross over odd sense amplifiers SA. The power lines P2-11' to P2-1$i$' formed over the even sense amplifier regions may be disposed below the power lines P2-21'~P2-2$i$' formed over the sub-memory cell arrays SMCA. The power lines P2-21' to P2-2$i$' over the odd sense amplifiers SA may be disposed above the power lines P2-21' to P2-2$i$' over the sub-memory cell arrays SMCA.

The global data input/output lines GIO may be disposed in a straight line between the power lines P2-11' to P2-1$i$' and the power lines P2-21' to P2-2$i$', which are disposed over the sub-memory cell arrays SMCA. Portions of the global data input/output lines GIO may diagonally branch towards the sense amplifiers SA and then continue in a straight line over the sense amplifier SA. In some embodiments, the global data input/output lines GIO may be disposed over the sense amplifiers SA with a substantially equal distance from both power lines P2-11' to P2-1$i$' and P2-21' to P2-2$i$'. By diagonally shifting the power lines P2-11' to P2-1$i$' and P2-21' to P2-2$i$' and the global data input/output lines GIO, the sense amplifiers SA may have substantially the same configuration with the reduction in contacts X and power lines that cross over the sense amplifiers SA.

Figure 4:
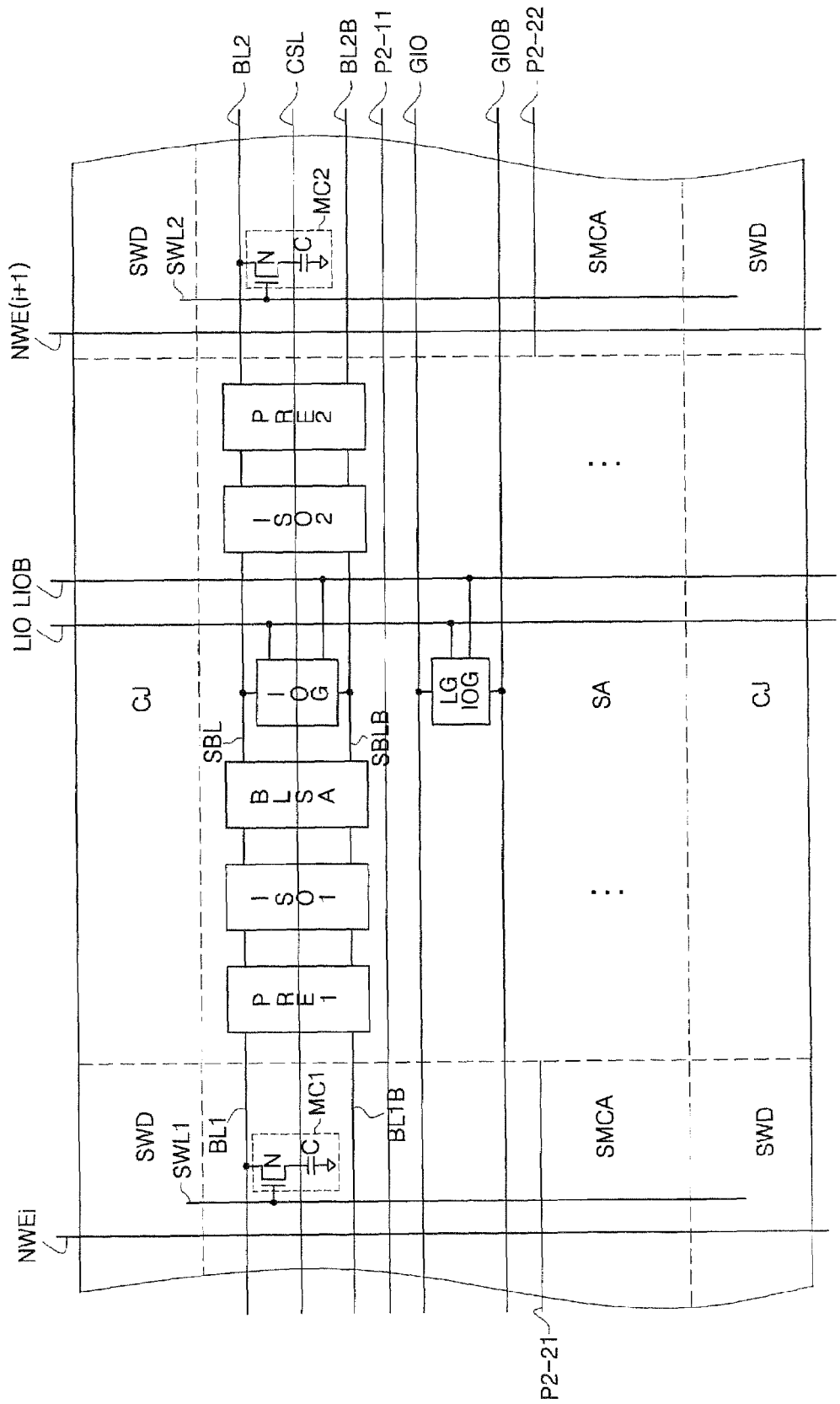
FIG. 4 is a block diagram of a sense amplifier in the memory device shown in FIG. 2 and FIG. 3.

FIG. 4 is a block diagram of a sense amplifier SA in the memory device shown in FIG. 2 and FIG. 3. Referring to FIG. 4, the sense amplifier SA is coupled to sub-memory cell arrays SMCA and conjunction regions CJ. The sub-memory cell arrays SMCA include memory cells MC1 and MC2 to store data. The memory cells MC1 and MC2 may be dynamic memory cells each comprising an NMOS transistor N connected to sub-word lines SWL1 and SWL2, bit line pairs BL1 and BL1B and BL2 and BL2B, and a capacitor C, respectively.

During memory cell MC1 access operations, the sub-word line SWL1 is selected, for example, by combining a signal transmitted to a word selection signal line (not shown) and a signal transmitted to a main word line NWEi. During memory cell MC2 access operations, the sub-word line SWL2 is selected, for example, by combining a signal transmitted to the word selection signal line (not shown) and a signal transmitted to the main word line (NEW(i+1)).

The sense amplifier SA includes a pre-charge circuit to pre-charge a pair of bit lines BL1 and BL1B and a pre-charge circuit PRE2 to pre-charge another pair of bit lines BL2 and BL2B. The sense amplifier SA includes a bit line isolation gate ISO1 disposed between the pair of bit lines BL1 and BL1B and a pair of sense bit lines SBL and SBLB, and a bit line isolation gate ISO2 disposed between the pair of bit lines BL2 and BL2B and the pair of sense bit lines SBL and SBLB. The sense amplifier SA includes a bit line sense amplifier BLSA to amplify signal levels of a pair of sense bit lines SBL and SBLB. The sense amplifier SA includes a data input/output gate IOG to transfer data between the pair of sense bit lines SBL and SBLB and a pair of local data input/output lines LIO and LIOB, and a local global input/output gate LGIOG to transfer data between the pair of local data input/output lines LIO and LIOB and a pair of global data input/output lines GIO and GIOB. The pair of local data input/output lines LIO and LIOB may be separately disposed in the sub-memory cell arrays. Although FIG. 4 shows the global data input/output lines GIO and GIOB formed over the sense amplifier SA and sub-memory cell arrays SMCA, in some embodiments, the global data input/output lines GIO and GIOB may be disposed over conjunction CJ and sub-word line drivers SWD. When the global data input/output lines GIO and GIOB are disposed over the conjunction region CJ and sub-word line driver SWD, the local global input/output gate LGIOG is disposed in the conjunction region CJ.

Although FIG. 4 shows power lines P2-1' to P2-1$i$' and P2-21' to P2-2$i$' disposed over the even or odd sense amplifiers SA, respectively, in some embodiments portions of the power lines P2-11' to P2-1$i$' and P2-21' to P2-2$i$' may extend over a region of the odd or even sense amplifiers SA, respectively. The above-mentioned configuration of signal and power lines according to embodiments the present invention can be applied not only to the global data input/output line GIO but also to the column selection signal line CSL. For instance, a predetermined number of column selection signal lines CSL may be disposed in a group, and power lines may be disposed at both ends of the column selection signal lines to stably transmit column selection signals CSL.

In the exemplary embodiment, in order to insulate signal lines disposed on the second layer from signal lines disposed on the first layer, an insulating layer may be disposed between the signal lines disposed on the first and second metal layers, and in order to insulate the signal lines disposed on the first layer from devices formed in a lower layer, an insulating layer may also be disposed therebetween.

As can be seen from the foregoing, a memory device and a method of arranging signal and power lines can simplify the top layout of a sense amplifier region by separating power lines disposed at both sides of a signal line to dispose the power lines at both sides of the signal line running over a sub-memory cell array region, and to dispose the power line at one side of the signal line running over the sense amplifier region.

Embodiments of the present invention have been disclosed herein and, although specific terms are employed, they are used and are to be interpreted in a generic and descriptive sense and not for purpose of limitation. Accordingly, it will be understood by those of ordinary skill in the art that various changes in form and details may be made without departing from the spirit and scope of the present invention as set forth in the following claims.

What is claimed is:

1. A device comprising:
   a plurality of sub-memory cell arrays having a plurality of memory cells;
   a plurality of sense amplifiers to sense and amplify data from the plurality of memory cells;
   a signal line disposed to cross over the sub-memory cell arrays and the sense amplifiers;
   first power lines disposed at one side of the signal line, and crossing over an odd-numbered sense amplifier and sub-memory cell arrays adjacent to both sides of the odd-numbered sense amplifier such that each first power line crosses less than all of the sense amplifiers; and
   second power lines disposed at the other side of the signal line, and crossing over an even-numbered sense amplifier and sub-memory cell arrays adjacent to both sides of the even-numbered sense amplifier such that each second power line crosses less than all of the sense amplifiers;
   where the sub-memory cell arrays and the sense amplifiers are alternately disposed adjacent to each other and in a line.

2. The device of claim 1 where the signal line, the first power lines, and the second power lines are substantially parallel.

3. The device of claim 1 where the first power lines and the second power lines include
   first and second sections that are substantially parallel to the signal line, the first sections disposed over the sub-memory cell arrays and the second sections disposed over the sense amplifiers, and
   the device further comprises third power lines diagonal to the signal line.

4. The device of claim 1 where the signal line and the first and second power lines are disposed on the same metal layer.

5. The device of claim 1 where the first and second power lines are configured to transmit substantially the same level of power to the sense amplifiers.

6. The device of claim 1 where the first and second power lines are configured to transmit different levels of power to associated sense amplifiers.

7. The device of claim 1 where each of the sense amplifiers includes
   a data input/output gate to exchange data with a pair of bit lines and a pair of local data input/output lines; and
   a local-to-global input/output gate to exchange data with the pair of local data input/output lines and the signal line, where the signal line is a pair of global data input/output lines.

8. The device of claim 7 where the pair of local data input/output lines are perpendicular to the pair of global data input/output lines and disposed on a first metal layer over the sense amplifier, where the pair of global data input/output lines are disposed on a second metal layer formed over the first metal layer.

9. A method comprising:
   configuring a memory device with a plurality of sub-memory cell arrays having memory cells to store data and a plurality of sense amplifiers to sense and amplify data from the memory cells, wherein the sub-memory cell arrays and the sense amplifiers are alternately disposed adjacent to each other and in a line;
   disposing a signal line to cross over the sub-memory cell arrays and the sense amplifier;
   disposing first power lines at one side of the signal line, and crossing over an odd-numbered sense amplifier and sub-memory cell arrays adjacent to both sides of the odd-numbered sense amplifier such that each first power line crosses less than all of the sense amplifiers; and
   disposing second power lines at the other side of the signal line, and crossing over an even-numbered sense amplifier and sub-memory cell arrays adjacent to both sides of the even-numbered sense amplifier such that each second power line crosses less than all of the sense amplifiers.

10. The method of claim 9 where the signal line is substantially parallel to the first and second power lines.

11. The method according to claim 10 further including disposing a third power line substantially perpendicular to the first and second power lines, the first and second power lines and the signal line corresponding to a first metal layer, and the third power lines corresponding to a second metal layer below the first metal layer.

12. The method of claim 10 where the signal line and the power lines are disposed on the same metal layer.

13. The method of claim 9 where the first and second power lines are configured to transmit substantially the same level of power to the sense amplifiers.

14. The method of claim 9 where the first and second power lines are configured to transmit different levels of power to associated sense amplifiers.

15. A device comprising:
- a plurality of sub-memory cell arrays, each having one or more memory cells to store data;
- a first set of one or more sense amplifiers to sense and amplify data from the memory cells associated with at least one of the sub-memory cell arrays;
- a second set of one or more sense amplifiers to sense and amplify data from the memory cells associated with at least another one of the sub-memory cell arrays;
- a signal line coupled to exchange signals with the first and second sets of sense amplifiers;
- a first power line coupled to the first set of the sense amplifiers, where the first power line is located on one side of the signal line; and
- a second power line coupled to the second set of the sense amplifiers, where the second power line is located on another side of the signal line;
- where the power lines include:
  - first and second sections that are substantially parallel to the signal line, the first sections disposed over the sub-memory cell arrays and the second sections disposed over the sense amplifiers, and
  - third sections that are diagonal to the signal and connecting the first sections with the second sections.

16. The device of claim 15 including one or more third power lines disposed perpendicular to the signal line and coupled to each of the sense amplifiers.

17. The device of claim 16 where the third power lines are disposed on a different metal layer than the signal line, the first power line, and the second power line.

18. The device of claim 15 where the first and second power lines are configured to electrically shield the signal line.

19. The device of claim 1, wherein:
- each first power line crosses only the corresponding odd-numbered sense amplifier of the sense amplifiers; and
- each second power line crosses only the corresponding even-numbered sense amplifier of the sense amplifiers.

* * * * *

UNITED STATES PATENT AND TRADEMARK OFFICE
CERTIFICATE OF CORRECTION

PATENT NO. : 7,630,223 B2 Page 1 of 1
APPLICATION NO. : 11/567655
DATED : December 8, 2009
INVENTOR(S) : Bong-Seok Chae It is certified that error appears in the above-identified patent and that said Letters Patent is hereby corrected as shown below:

Column 5, line 15, the words "P2-1'" should read -- P2-11' --.

Signed and Sealed this

Twenty-third Day of February, 2010

David J. Kappos
*Director of the United States Patent and Trademark Office*